(12) United States Patent
Tabatabaei

(10) Patent No.: US 7,941,287 B2
(45) Date of Patent: May 10, 2011

(54) PERIODIC JITTER (PJ) MEASUREMENT METHODOLOGY

(76) Inventor: Sassan Tabatabaei, Sunnyvale, CA (US)

( * ) Notice: Subject to any disclaimer, the term of this patent is extended or adjusted under 35 U.S.C. 154(b) by 322 days.

(21) Appl. No.: 12/172,845

(22) Filed: Jul. 14, 2008

(65) Prior Publication Data

US 2008/0319691 A1 Dec. 25, 2008

Related U.S. Application Data

(62) Division of application No. 11/301,275, filed on Dec. 8, 2005, now Pat. No. 7,400,988.

(51) Int. Cl.
*G01R 13/00* (2006.01)
(52) U.S. Cl. ............ 702/69; 375/228; 375/371; 702/66; 702/79
(58) Field of Classification Search .................. 702/66, 702/69, 79, 89, 106, 176, 178; 324/76.77; 368/113, 121; 375/224, 228, 371
See application file for complete search history.

(56) References Cited

U.S. PATENT DOCUMENTS

| | | | |
|---|---|---|---|
| 4,757,452 A | 7/1988 | Scott et al. | |
| 4,908,784 A | 3/1990 | Box et al. | |
| 4,982,350 A | 1/1991 | Perna et al. | |
| 6,091,671 A | 7/2000 | Kattan | |
| 6,181,649 B1 | 1/2001 | Kattan | |
| 6,185,509 B1 | 2/2001 | Wilstrup et al. | |
| 6,194,925 B1 | 2/2001 | Kimsal et al. | |
| 6,226,231 B1 | 5/2001 | Kattan | |
| 6,246,737 B1 | 6/2001 | Kuglin | |
| 6,298,315 B1 | 10/2001 | Li et al. | |
| 6,356,850 B1 | 3/2002 | Wilstrup et al. | |
| 6,456,959 B1 | 9/2002 | Kattan | |
| 6,621,767 B1 | 9/2003 | Kattan | |
| 6,665,808 B1 | 12/2003 | Schinzel | |
| 6,701,269 B1 | 3/2004 | Jungerman et al. | |
| 6,701,280 B2 | 3/2004 | Horne et al. | |
| 6,822,485 B2 | 11/2004 | Kattan | |
| 6,832,172 B2 | 12/2004 | Ward et al. | |
| 6,876,938 B2 | 4/2005 | Kattan | |
| 6,898,535 B2 | 5/2005 | Draving | |
| 6,931,335 B2 | 8/2005 | Mueller | |
| 6,931,338 B2 | 8/2005 | Kattan | |
| 6,999,382 B2 | 2/2006 | Horne | |
| 7,003,180 B2 | 2/2006 | Richardson et al. | |
| 7,076,385 B2 | 7/2006 | Horne et al. | |
| 7,164,999 B2 | 1/2007 | Tabatabaei et al. | |
| 7,203,610 B2 | 4/2007 | Tabatabaei et al. | |
| 7,239,969 B2 | 7/2007 | Tabatabaei et al. | |
| 7,292,947 B1 | 11/2007 | Tabatabaei | |
| 7,400,988 B2 | 7/2008 | Tabatabaei | |
| 7,512,196 B2 | 3/2009 | Tabatabaei | |
| 2002/0084972 A1 | 7/2002 | Kim | |
| 2002/0174159 A1 | 11/2002 | Laquai | |

(Continued)

OTHER PUBLICATIONS

Search Report for International Application No. PCT/US05/45126 dated Jul. 1, 2008.

(Continued)

*Primary Examiner* — John H Le
(74) *Attorney, Agent, or Firm* — Dority & Manning, P.A.

(57) ABSTRACT

Methodologies are disclosed for analyzing periodic jitter is a signal pattern using a continuous time interval analyzer. Sampled signal patterns may be correlated using time interval error calculations to determine start and stop sequences within sampled blocks of signal data while sampling synchronization may be achieved based on time interval calculations or pattern interval error calculations.

3 Claims, 5 Drawing Sheets

U.S. PATENT DOCUMENTS

| | | |
|---|---|---|
| 2003/0041294 A1 | 2/2003 | Moll et al. |
| 2003/0125888 A1 | 7/2003 | Yamaguchi et al. |
| 2003/0223376 A1 | 12/2003 | Elliot et al. |
| 2004/0136450 A1 | 7/2004 | Guenther |
| 2004/0143406 A1 | 7/2004 | Nishikobara et al. |
| 2004/0158462 A1 | 8/2004 | Rutledge et al. |
| 2004/0208129 A1 | 10/2004 | Old et al. |
| 2005/0044463 A1 | 2/2005 | Frisch |
| 2005/0075810 A1 | 4/2005 | Laquai |
| 2005/0097420 A1 | 5/2005 | Frisch et al. |
| 2005/0152488 A1 | 7/2005 | Buckwalter et al. |
| 2005/0177758 A1 | 8/2005 | Stickle |
| 2005/0243960 A1 | 11/2005 | Jungerman |
| 2005/0286670 A1 | 12/2005 | Jungerman |
| 2006/0045175 A1 | 3/2006 | Draving et al. |
| 2007/0110146 A1 | 5/2007 | Tabatabaei |

OTHER PUBLICATIONS

Technical Document—*Jitter Separation-50 Mb/s To Over 40 Gb/s Using the Agilent 86100C Infiniium DCA-J*; pp. 1 through 27, Agilent Technologies, Inc., Dec. 2003.

Technical Document—*Analyzing Jitter Using a Spectrum Approach*; pp. 1 through 8; Tektronix, Inc., 2002.

Technical Document—*Measuring Jitter in Digital Systems*, Application Note 1448-1, pp. 1 through 16, Agilent Technologies, Inc., Jun. 2003.

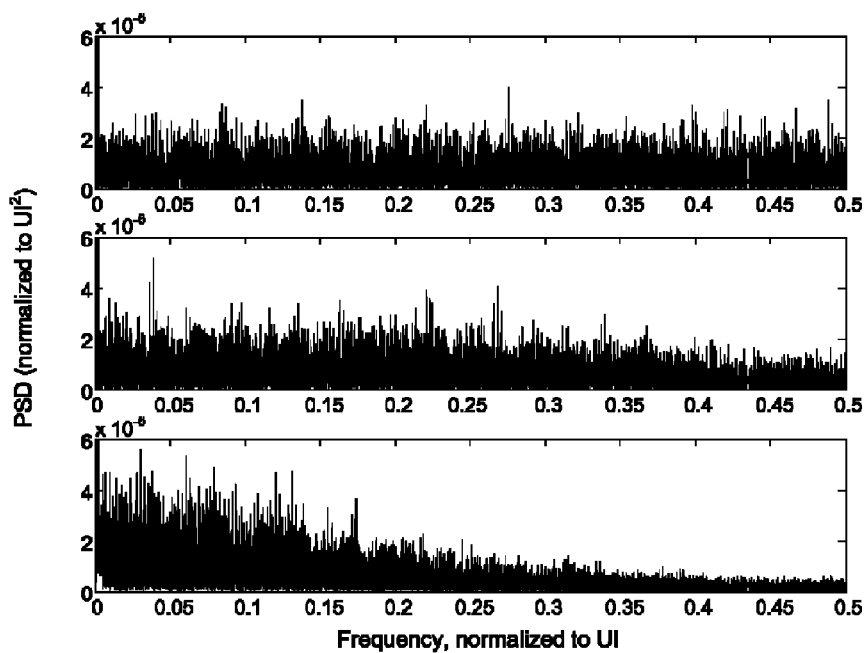
FIG. 2a
FIG. 2b
FIG. 2c
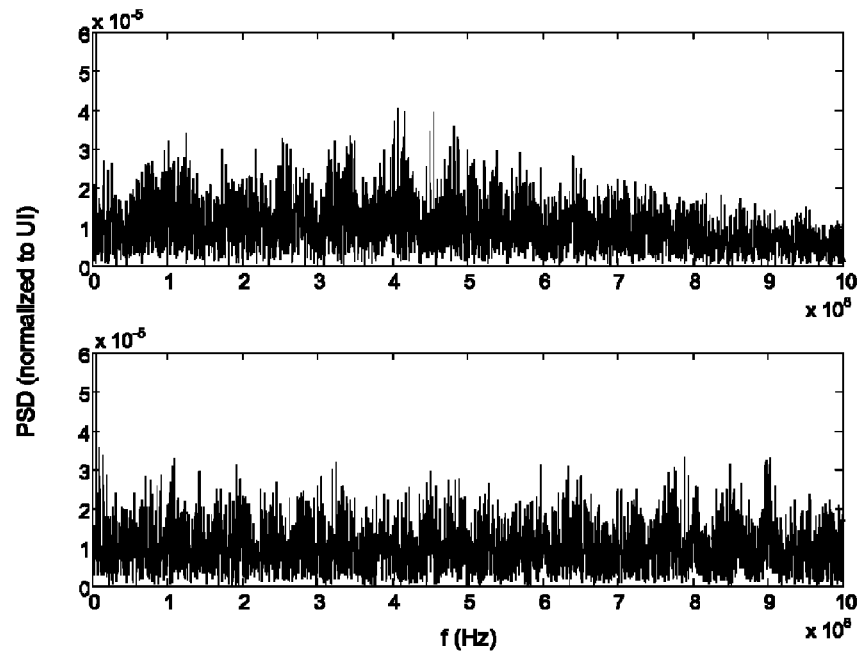
FIG. 3a
FIG. 3b

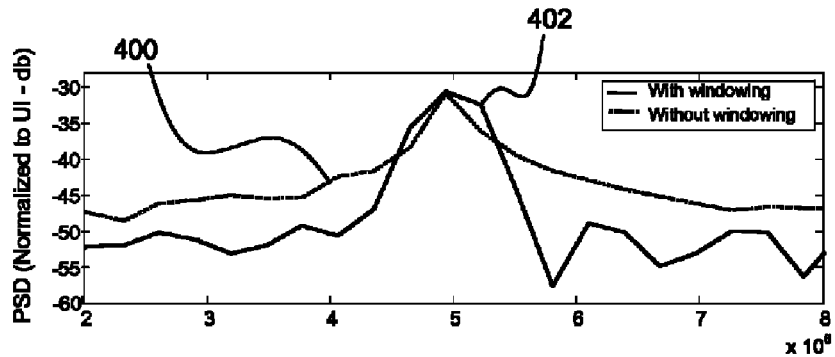
FIG. 4a
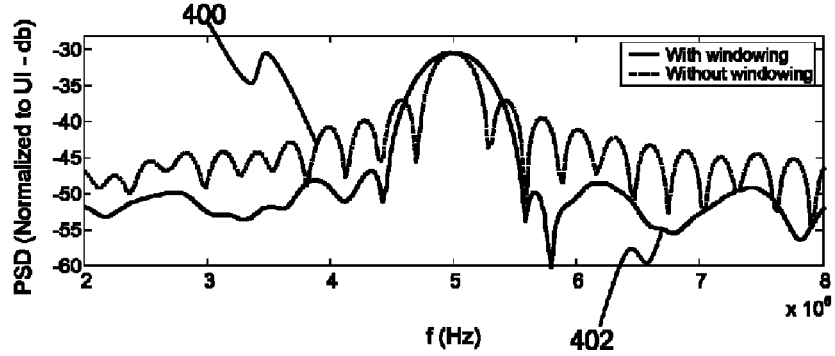
FIG. 4b
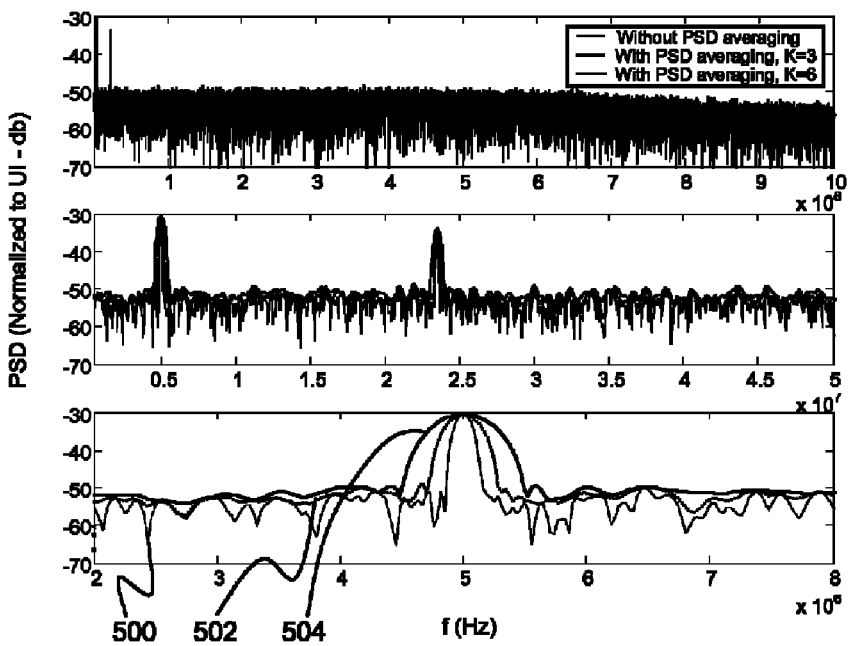
FIG. 5a
FIG. 5b
FIG. 5c

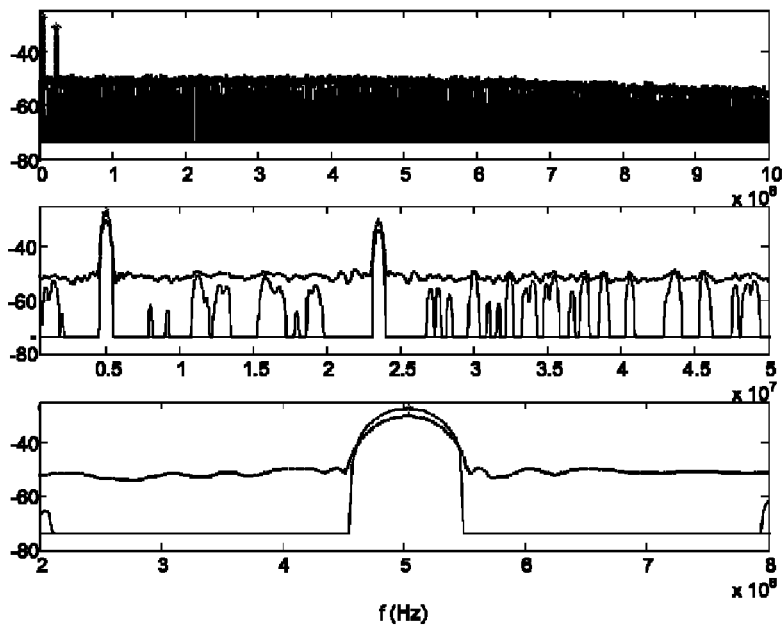
FIG. 6a
FIG. 6b
FIG. 6c
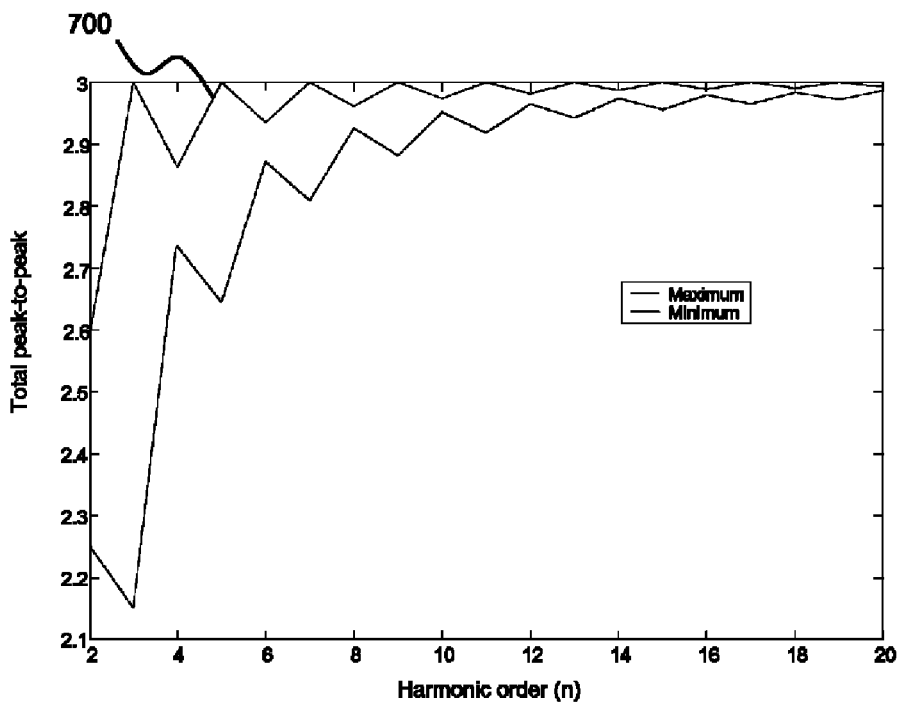
FIG. 7

PERIODIC JITTER (PJ) MEASUREMENT METHODOLOGY

CROSS REFERENCE TO RELATED APPLICATIONS

This application claims priority under 35 U.S.C. §119(e) of Provisional U.S. Patent Application Ser. No. 60/634,205 filed Dec. 8, 2004, entitled "PERIODIC JITTER (PJ) MEASUREMENT METHODOLOGY," which is hereby incorporated by reference in its entirety for all purposes. This application also claims priority under 35 U.S.C. §120 as a divisional application of U.S. patent application Ser. No. 11/301,275 filed Dec. 8, 2005, entitled "PERIODIC JITTER (PJ) MEASUREMENT METHODOLOGY," which is hereby incorporated by reference in its entirety for all purposes.

FIELD OF THE INVENTION

The present subject matter relates to the characterization and measurement of jitter as related to various communications signals. More particularly, the present subject matter relates to methodologies for measuring periodic jitter using time interval analysis methodologies.

BACKGROUND OF THE INVENTION

Jitter is defined as deviations of signal edges from their ideal positions in time. Jitter characterization is an integral part of performance qualification for a wide variety of application, such as wideband serial communication (SONET, SDH), high-speed serial input/output (IO) devices (Hyper-Transport, PCI-Express, Infiniband, RapidIO), and timing circuits including clock generators, and data recovery units. In serial communication applications, jitter affects the link bit-error-rate (BER), which is a key performance parameter.

To qualify this impact, it is necessary to decompose jitter to its various components, because each jitter type has a different effect on BER. Different types of jitter include, Random jitter (RJ), Data-dependent jitter (DDJ), Duty-cycle distortion (DCD), Periodic jitter (PJ), and Bounded uncorrelated jitter (BUJ)

While various methods have been used for measuring jitter components including the use of spectrum analyzers, oscilloscopes (both real-time and undersampling), bit-error rate analyzers, and time interval analyzers (TIA), no design has emerged that generally encompasses all of the desired characteristics as hereafter presented in accordance with the subject technology.

In view of the recognized features encountered in the prior art and addressed by the present subject matter, an improved measurement methodology based on continuous time interval analyzers (CTIAs) has been provided. A continuous time interval analyzer (CTIA) is an attractive solution because it can provide high bandwidth, fast measurement, and excellent accuracy.

SUMMARY OF THE INVENTION

A continuous time interval analyzer (CTIA) is an instrument that can produce accurate timing information of events within a signal. In serial communications, events are defined as rising and/or falling edges. An ideal CTIA will be able to measure the occurrence time for all the edges in a specified segment of a signal. Real CTIAs, however, typically measure the occurrence time of one or several events and the time interval between them events once every $T_s$ seconds. $T_s$ is the time required by CTIA internal vernier and control circuitries to complete a time interval measurement and is often in the range of a few hundred nano-seconds. Since the bit-rate of many modern systems is more than 1 Gbps, such CTIAs will miss many events between two consecutive measurements, effectively undersampling the signal edge timing variations or jitter content.

CTIAs such as GuideTech's GT4000 generate the following information for each measurement:

1. Time interval (P) between a start and a stop event
2. The absolute occurrence time (t) of the time interval start event relative a reference event
3. The time interval start event count number relative to the reference event (E)
4. The number of events between the start and stop events of the measured time interval ($E_P$).

An interval span is associated with each P, which represents the number of ideal data bits between the time interval start and stop events. The interval span is often expressed in terms of UI or bits, where UI is defined as the ideal bit period, and is estimated as average bit interval. The UI span, denoted by U, can generally be obtained from the E sequence and knowledge of the reference edge, but it may also be estimated from P if P deviates less than half UI from its ideal value).

An effective PJ measurement methodology is based on estimation of power spectral density (PSD). PSD is a powerful technique to detect periodic components in a signal that includes stochastic components. Different methods have been proposed for PSD estimation, including periodogram, autocorrelation (sometimes called smoothed periodogram, or Blackman-Tukey method), and parametric methods.

For estimating PSD with undersampled CTIA data, a modified version of smoothed periodogram method is selected. The approach reported here differs from previous approaches in two ways: First, a statistical measure of auto-correlation function (expected value) is obtained as opposed to a time domain measure, and second, interpolation is used to construct a uniformly sampled function from an otherwise non-uniformly sampled autocorrelation function. This is important for performing FFT operation to obtain PSD.

The above properties of the method result in a shaped and highly variable synthetic PSD noise floor (synthetic because noise floor has large components due statistical operation even in the absence of any random noise). Special sampling guidelines and PSD processing steps are introduced to resolve these issues.

The techniques herein presented are generalized for use with most continuous time interval analyzers (CTIAs), but certain assumptions used here are based on the capability of CTIA equipment developed by GuideTech.

Additional objects and advantages of the present subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIGS. 2a-2c show how differing levels of interpolation affect the noise floor in PSD for a 2 Gbps signal and arbitrary pattern selection to adjust the number of interpolated point;

FIGS. 3a and 3b illustrate the PSD for a 2 Gbps signal with differing signal patterns;

FIGS. 4a and 4b show the effects of windowing and zero-padding;

FIGS. 5a-5c illustrate the effect of PSD averaging using sequence partitioning;

FIGS. 6a-6c show that SWSQ filtering attenuates the noise floor and amplifies the peaks;

FIG. 7 shows how the total peak-to-peak PJ varies versus n;

Figure 1A:
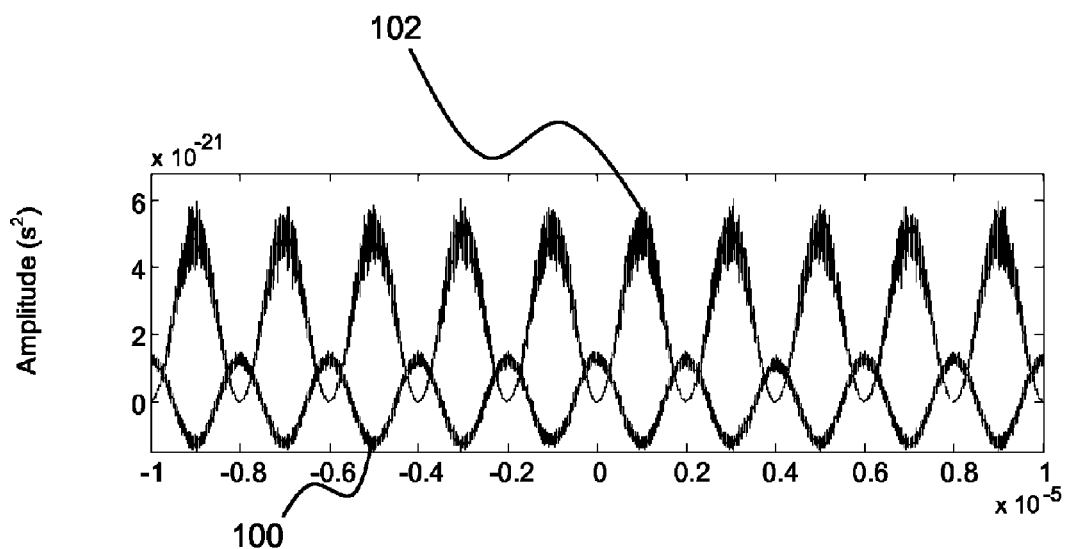
FIGS. 1a and 1b illustrate the autocorrelation function obtained from the direct and N-variance methods.

Repeat use of reference characters throughout the present specification and appended drawings is intended to represent same or analogous features or elements of the invention.

DETAILED DESCRIPTION OF THE PREFERRED EMBODIMENTS

As discussed in the Summary of the Invention section, the present subject matter is particularly concerned with methodologies involving the use of a continuous time interval analyzer (CTIA) to provide effective periodic jitter (PJ) measurement.

Selected combinations of aspects of the disclosed technology correspond to a plurality of different embodiments of the present invention. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Assume $v(n)$ denotes a finite length (Q) record of the uniformly sampled jitter signal $\tau_J(n)$, which may contains random and deterministic components:

$$v(n) = \begin{cases} \tau_J(n) & 0 \leq n \leq Q-1 \\ 0 & \text{otherwise} \end{cases} \quad \text{Eqn. 1}$$

An estimate of the aperiodic autocorrelation of this record is given as below:

$$c_{vv}(m) = \sum_{n=0}^{Q-1} v(n)v(n+m) \quad \text{Eqn. 2}$$

$$= \begin{cases} \sum_{n=0}^{Q-|m|-1} \tau_J(n)\tau_J(n+|m|) & |m| \leq Q-1 \\ 0 & \text{otherwise} \end{cases}$$

An unbiased estimate of $\tau_J(n)$ autocorrelation sequence, $\hat{\psi}_{\tau\tau}$, is given by:

$$\hat{\psi}_{\tau\tau}(m) = \left(\frac{1}{Q-|m|}\right) c_{vv}(m) \quad \text{Eqn. 3}$$

This estimate is unbiased for a stationary and ergodic random process because it represents the expected value of autocorrelation sequence:

$$\psi_{\tau\tau}(m) = E[\tau_J(n)\tau_J(n+m)] \quad \text{Eqn. 4}$$

where m is the lag index. From Eqn. 2 and Eqn. 3, it can be shown that applying triangular (Bartlett) windowing to the $\psi_{\tau\tau}$, and performing FFT on the result provides an estimate of $v(n)$ periodogram, which may be used as a biased estimate of PSD. On the other hand, performing FFT operation on $\psi_{\tau\tau}$ provides an unbiased estimate of $\tau_J(n)$ PSD. To obtain a smooth PSD and reduce sidelobe peaks due to finite length of data record $\psi_{\tau\tau}$ is multiplied by an appropriate windowing sequence and then zero-padded. Therefore, the PSD estimate $\Psi_{\tau\tau}(\omega)$ is obtained as below:

$$\Psi_{\tau\tau}(\omega) = \text{FFT}((\psi_{\tau\tau}(m) \cdot w(m)), L) \quad \text{Eqn. 5}$$

where, $w(m)$ is the windowing function and $L=2^t$ (t is an integer) is FFT length after the sequence $\psi_{\tau\tau}(m) \cdot w(m)$ is zero-padded.

From above discussion, to detect periodic components in a signal, it is sufficient to compute an estimate of $\psi_{\tau\tau}$, and analyze it in frequency domain using FFT. Two methods can be used to obtain $\psi_{\tau\tau}$ using CTIAs: direct autocorrelation and N-variance methods. These methods are described later herein. Both methods provide statistical estimate of $\psi_{\tau\tau}$, which result in a fairly significant and sharply varying $\Psi_{\tau\tau}(\omega)$ noise floor. The method of smoothing $\Psi_{\tau\tau}(\omega)$, which is a necessary step for identifying significant PJ peaks is described later herein.

Let us assume that the CTIA generates three numbers for a time interval measurement sample: an absolute value of the time interval start time, t, the event count of the time interval start edge, E, and the time interval, P (the time between the start and stop edges of the time interval). Assume N time interval samples are taken randomly (randomness applies to the start time), i.e., no correlation of the start times with known deterministic sources such as the pattern, or periodic components. Random sampling is a preferred part of statistical autocorrelation computation; otherwise spurious components will appear in the PSD.

The P values have to be selected to cover a·UI to b·UI span. Next step is to form time interval error (TIE) estimate for the start and stop edges of each sample:

$$\tau_{ST}(i) = t(i) - t_{ideal}(i)$$

$$\tau_{SP}(i) = t(i) + P(i) - (t_{ideal}(i) + P_{ideal}(i))$$

$$i = 1, \ldots, N \quad \text{Eqn. 6}$$

where, $\tau_{ST}(i)$ and $\tau_{SP}(i)$ represent the TIE sequences associated with start and stop edges, respectively, and $t_{ideal}$ and $P_{ideal}$ are the ideal values of the start time and the time interval from a single value estimate of average bit rate for the i-th sample measurement. $\tau_{ST}(i)$ is a sample of the jitter signal, and $\tau_{SP}(i)$ is another sample with a time delay of $P_{ideal}(i)$ relative to $\tau_{ST}(i)$, i.e.:

$$\tau_{ST}(i) = \tau_J(n_i)$$

$$\tau_{SP}(i) = \tau_J(n_i + m) \qquad \text{Eqn. 7}$$

where, $n_i$ is the estimate of sampling time in UI for the i-th sample,
$m = P_{ideal}(n_i)/UI$ is the lag time in UI, and $\tau_J(n_i)$ are samples of the jitter signal. Therefore, time interval measurements with different values of $P_{ideal}(n)$ provide an estimate of jitter signal and its delayed version for different lag values. The sampling should be repeated such that $M_m$ samples are taken for each lag m. This forms the basis for estimating the autocorrelation function $\psi_{\tau\tau}$ based on Eqn. 3, as follows:

$$\psi_{\tau\tau}(m) = \frac{1}{M_m} \sum_{i=1}^{M_m} \tau_{ST}(i) \tau_{SP}(i) \Big|_{P_{ideal} = m \cdot UI} \qquad \text{Eqn. 8}$$

$$= \frac{1}{M_m} \sum_{i=1}^{M_m} \tau_J(n_i) \tau_J(n_i + m)$$

The $P_{ideal}$/UI span corresponds to the time lag m in Eqn. 3. For a stationary jitter signal $\tau_J$, the $\psi_{\tau\tau}(m)$ values are independent of $n_i$. For an ergodic signal, the values of $n_i$ do not have to be known, however, is such cases it is preferred to select $n_i$ randomly to ensure the averaging operation in Eqn. 8 is valid.

Direct autocorrelation estimation method requires knowledge of t(i), the start of the time interval sample, and also $t_{ideal}(i)$. For some CTIAs, t(i) measurements may not be available or obtaining $t_{ideal}(i)$ may be difficult. In such cases, N-variance method may be used to estimate autocorrelation function because it does not require the knowledge of t(i) or $t_{ideal}(i)$. N-variance sequence is formed as follows:

$$\sigma_N(m) = E[(P(i) - \overline{P(i)})^2] \qquad \text{Eqn. 9}$$

$$= \frac{1}{M_m} \sum_{i=1}^{M_m} (P_m(i) - \overline{P_m(i)})^2$$

where $P_m(i) = P(i)|_{P_{ideal} = m \cdot UI}$ is the time interval, which ideally spans m·UI. Eqn. 9 provides as estimate of $\psi_{\tau\tau}$, as shown below:

$$\sigma_N(m) = \frac{1}{M_m} \sum_{i=1}^{M_m} (P_m(i) - \overline{P_m(i)})^2 \Big|_{P_{ideal} = m \cdot UI} \qquad \text{Eqn. 10}$$

$$= \frac{1}{M_m} \sum_{i=1}^{M_m} [(t(n_i) - \overline{t(n_i)}) - (t(n_i + m) - \overline{t(n_i + m)})]^2$$

$$= \frac{1}{M_m} \sum_{i=1}^{M_m} [(t(n_i) - \overline{t(n_i)})^2 +$$

$$(t(n_i + m) - \overline{t(n_i + m)})^2 - 2(t(n_i) - \overline{t(n_i)}) \cdot$$

$$(t(n_i + m) - \overline{t(n_i + m)})]$$

Eqn. 10 can be simplified to:

$$\sigma_N(m) = \sigma_J^2 + \sigma_J^2 - \frac{1}{M_m} \sum_{i=1}^{M_m} 2\hat{\tau}(n_i) \cdot \hat{\tau}(n_i + m)] \qquad \text{Eqn. 11}$$

$$= C + 2\left[\frac{1}{M_m} \sum_{i=1}^{M_m} (\hat{\tau}(n_i) \cdot \hat{\tau}(n_i + m))\right]$$

for $m = a, \ldots, b$ where $\sigma_J^2$ is the TIE sequence variance, $C = 2\sigma_J^2$, and $\hat{\tau} = t - \bar{t}$. If $M_m$ is sufficiently large and $n_i$'s are selected randomly, C will tend to a constant number and $\bar{t}$; $t_{ideal}$, which result in the following relation from Eqn. 11:

$$\sigma_N(m) = C - 2\psi_{\tau\tau} \rightarrow \psi_{\tau\tau} = (C - \sigma_N(m))/2 \qquad \text{Eqn. 12}$$

In practice, C varies statistically, which raises the $\psi_{\tau\tau}$ noise floor. Also, $\bar{t}$; $t_{ideal}$ is only true in statistical sense; i.e., the variations of $\bar{t}$ from $t_{ideal}$ will increase the noise floor as well. However, if samples for a lag value of m are correlated with specific edges in the pattern, the data-dependent part of jitter tends to be cancelled out, which helps to separate periodic jitter more efficiently.

Computation of Eqn. 12 requires that the ideal UI span of all $P(n_i)$'s to be known to obtain $m_i = P_{ideal}(n_i)/UI$. This, in general, requires pattern matching or synchronization. To simplify the measurement process by avoiding the need for pattern matching, an estimate of $m_i = \text{Rnd}[P(n_i)/UI]$ (Rnd[x] rounds x towards the nearest integer) may be used. This is accurate if total jitter over large values of $m_i$ does not exceed half of one UI, otherwise, some samples will be assigned to adjacent lag values erroneously. Such error effectively introduces non-linearity in N-variance sequence estimation, which may result in generation of additional periodic jitter harmonics.

Figure 1B:
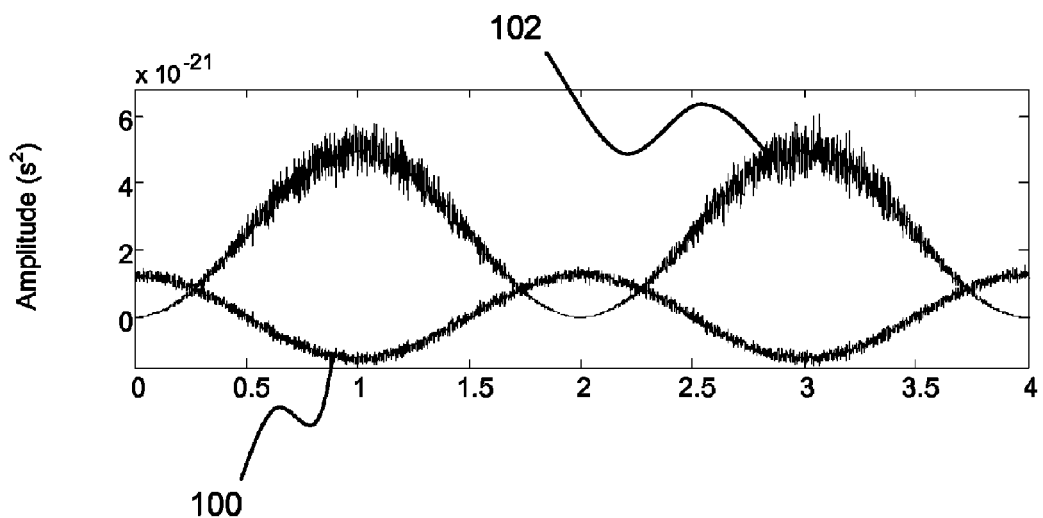

FIGS. 1a and 1b illustrates the autocorrelation function obtained from the direct and N-variance methods. The plots are obtained for a simulated 1 GHz clock signal with 50 ps PJ at 1 MHz. The FIG. 1a plot is zoomed in the FIG. 1b plot to show more clearly the behaviour of the N-variance function. The 1 MHz jitter component is clearly visible in both the N-variance 100 and direct autocorrelation 102 sequences.

Autocorrelation function is an even function; i.e.:

$$\psi_{\tau\tau}(-m) = \psi_{\tau\tau}(m) \text{ for } m=0, \ldots, N \qquad \text{Eqn. 13}$$

Therefore, the sequence $\psi_{\tau\tau}$ computed previously can be augmented with mirror elements as in Eqn. 13 to form a longer even autocorrelation function. Mirroring provides larger sample size, which increases frequency resolution. In some cases, however, because of sampling restrictions, the values of $\psi_{\tau\tau}(m)$ are not known for $m=0, \ldots, a$, where a>5. The unknown samples are usually interpolated, however, interpolation of points when there is no close samples will have significant error, which may result in artificial signal components. Therefore, it is recommended to avoid augmenting $\psi_{\tau\tau}(m)$ with its mirror if more than first five samples of $\psi_{\tau\tau}(m)$ are missing.

For clock signals, it is fairly straightforward to ensure all UI spans from a·UI to b·UI are covered (typically a=1 and b=N) by the time interval samples. But, for data streams, there might not be any sample for some UI spans in the specified range. In such cases, interpolation may be used to estimate the autocorrelation value for missing lag values. Cubic-spline interpolation produces good results because it is suitable when less than five consecutive are missing. It is also well suited for interpolation of signal with strong periodic components.

Many interpolation methods, including cubic-spline, estimate the value of a missing point of a sequence by using the existing neighbouring samples. Therefore, interpolation may cause significant correlation of adjacent samples in interpolated sequence. This results in reduced variations within adjacent samples, which in turn reduces the high-frequency noise floor power and increases the power at lower frequencies. This phenomenon is apparent in the PSD obtained from interpolated autocorrelation sequences as a shaped noise floor, where noise floor is larger in lower frequencies than higher ones. Because of the raised noise floor at lower frequencies, the estimation accuracy of PJ components at lower frequencies may be degraded.

FIGS. 2a-2c shows how interpolation affects the noise floor in PSD for a 2 Gbps signal and arbitrary pattern selection to adjust the number of interpolated point. FIGS. 2a-2c represent the impact of interpolation on PSD noise floor where FIG. 2a represents no interpolation, FIG. 2b represents 20% interpolation, and FIG. 2c represents 48% interpolation. As the percentage of interpolated samples relative to the total samples increases, the noise floor condenses towards the lower frequencies.

FIGS. 3a and 3b illustrate the PSD for 2 Gbps signal with patterns of K28.5 and PRBS7 and 50 ps PJ at 5 MHz. The noise floor for K28.5 pattern is more condensed towards lower frequencies than that of PRBS7, which suggests that there are more $\psi_{\tau\tau}(m)$ missing points for K28.5 pattern than PRBS. This is consistent with the fact that PRBS7 is a longer and more randomized pattern. In FIGS. 3a and 3b the PSD noise floor, bit rate=2Gbps, PJ=50 ps@5 MHz. FIG. 3a represents a K28.5 pattern, while FIG. 3b represents a PRBS7 pattern.

Computing $t_{ideal}$ and $P_{ideal}$ in Eqn. 6 requires the knowledge of pattern and also the specific pattern edge at one or more time interval sample starts. This is referred to as pattern matching or pattern synchronization. Pattern synchronization may be achieved using the following methods: a trigger signal, a post-measurement synchronization, and a pre-measurement synchronization.

The use of a trigger signal method is possible if the CTIA has the capability of synchronizing the start of time interval measurement to an external signal. In this case, the start of sampling run is a known edge within the pattern. Since pattern is deterministic, the rest of the edges can be tracked based on their event count number (E) relative to the start of sampling.

Post-measurement software pattern synchronization (Post-Match) for most patterns it is possible to collect a number of time interval samples with a pre-programmed sequence of event counts. The event count sequence may be correlated to the pattern, or be random. For most patterns, the event counts and time interval spans are uniquely related, which make it possible to match the sequence with pattern.

The post-measurement software synchronization is a software post-processing activity. However, it limits the ability to take specific time interval samples relative to pattern edges. This may be a limiting factor in increasing the measurement time or accuracy. A remedy is to measure a number of samples and use algorithm of PostMatch continuously to look for the pattern match without stopping the sampling process. As soon as pattern match is found, the software can adjust the even count number dynamically to select specific edges of pattern for subsequent samples.

The PostMatch method suits the hardware architecture of GuideTech CTIA equipment. A PostMatch algorithm for specific sampling process, which can be extended to random sampling as well is presented herein after.

PSD can be computed from autocorrelation function $\psi_{\tau\tau}(m)$. To compute smoothed PSD, $\psi_{\tau\tau}(m)$ has to pass through windowing, zero-padding, FFT operation, and smoothing algorithm. Performing FFT on a finite sequence is equivalent to applying a rectangular window to an infinite length sequence. Windowing in time domain is equivalent to convolution in frequency domain. Therefore, a rectangular window results in introduction of significant sidelobes in FFT sequence. To reduce the sidelobes, other windowing sequences are applied to the time domain sequence w(m).

Windowing causes loss of signal energy. Therefore, the total energy of windowed sequence and also the frequency peaks do not match that of non-windowed sequence. Therefore, it is necessary to compensate the windowing loss by using a scaling factor $k_2$. Because windowing is equivalent to convolution in frequency domain, a scaling factor that normalizes the maximum of $|W(\omega)|=|FFT[w(m)]|$ to one will maintain the true value of maximum peaks in frequency domain:

$$k_2 = \frac{N_A}{\max|W(\omega)|} \qquad \text{Eqn. 14}$$

Also, any DC component of $\psi_{\tau\tau}(m)$ will produce a FFT peak at zero frequency, which can lead to distortion at frequencies close to zero and cause loss of accuracy in estimating low frequency PJ. To avoid this problem, the DC component $k_1$ is subtracted from $\psi_{\tau\tau}(m)$, where $k_1$ is computed from below:

$$k_1 = \frac{\sum_{k=1}^{N_A} w(k)\psi_{\tau\tau}(k)}{\sum_{k=1}^{N_A} w(k)} \qquad \text{Eqn. 15}$$

Applying $k_1$ and $k_2$, results in the following widowed autocorrelation:

$$\psi_w(m)=k_2\cdot(\psi_{\tau\tau}(m)-k_1)\cdot w(m) \qquad \text{Eqn. 16}$$

A divide by two will also be necessary if N-variance sequence is used instead of $\psi_w(m)$.

The windowed autocorrelation sequence, $\psi_w(m)$ should be zero-padded before applying FFT for two reasons:
1. FFT algorithms are much more efficient if the original sequence is zero-padded to form a sequence with a length equal to power of two ($2^t$, t is an integer).
2. Zero-padding in time-domain is equivalent to interpolation in FFT sequence. This interpolation does not increase frequency resolution, but it provides smoother PSD sequence, which reduces the error that may result from lack of any sample close to the maximum FFT peak. The rule of thumb is to have zero-padded sequence length approximately $2.5N_A$. If $2.5N_A$ becomes too large, any power of two that is larger than $N_A$ may be used at the expense of small error in peak estimation.

The zero-padded sequence is denoted by $\psi_{w0}(m)$:

$$\psi_{w0}(m) = \begin{cases} \psi_w(m) & |m| \leq N_A \\ 0 & N_A < |m| < 2^t \end{cases} \qquad \text{Eqn. 17}$$

where t is an integer, such that $2.5 N_A < 2^t$ (or $N_A < 2^t$ if $N_A$ is already too large).

Efficient algorithms exist to compute FFT of a sequence, including the ones that suit memory-limited systems. Many DSP libraries include FFT functions as standard feature.

Applying FFT operation to the windowed and zero-padded sequence, $\psi_{w0}(m)$, yield the PSD sequence, $\Psi_{w0}(\omega)$:

$$\Psi_{w0}(\omega) = \frac{FFT(\psi_{w0}(m))}{N_A} \quad \text{Eqn. 18}$$

where $N_A$ is the length of $\psi_w(m)$ sequence (autocorrelation before zero-padding). FIGS. 4a and 4b show the effect of windowing and zero-padding; Kaiser windowing is used in this case. FIG. 4a represents no-zero padding while FIG. 4b is with zero padding. In both FIGS. 4a and 4b, line 400 represents measurements made without windowing while line 402 represents measurements with windowing.

$\psi_{\tau\tau}(m)$ is a statistical estimate due to the random selection of $n_i$ in Eqn. 8 or Eqn. 11. This results in generation of some random components due to the random sampling of periodic or deterministic jitter components. Such random components contribute to a significant noise floor. To demonstrate how this noise floor is generated, assume the jitter signal only includes a periodic components, i.e., $\tau_j(n) = A \sin(\omega_1 \cdot n \cdot UI)$. From Eqn. 8, $$\psi_{\tau\tau}(m) = \frac{1}{M_m} \sum_{i=1}^{M_m} A \sin(\omega_1 \cdot n_i \cdot UI) A \sin(\omega_1 \cdot (n_i + m) \cdot UI) \quad \text{Eqn. 19}$$

$$= \frac{A^2}{2 M_m} \sum_{i=1}^{M_m} [\cos(2\omega_1 \cdot n_i \cdot UI + \omega_1 \cdot m \cdot UI) + \cos(\omega_1 \cdot m \cdot UI)]$$

$$= \frac{A^2}{2 M_m} \sum_{i=1}^{M_m} [\cos(2\omega_1 \cdot n_i \cdot UI + \omega_1 \cdot m \cdot UI)] + \frac{A^2}{2} \cos(\omega_1 \cdot m \cdot UI)$$

$$= \psi_{sn}(m) + E[\psi_{\tau\tau}(m)]$$

where $$\psi_{sn}(m) = (A^2 / 2 M_m) \sum_{i=1}^{M_m} [\cos(2\omega_1 \cdot n_i \cdot UI + \omega_1 \cdot m \cdot UI)] \quad \text{Eqn. 20}$$

$$E[\psi_{\tau\tau}(m)] = (A^2 / 2) \cos(\omega_1 \cdot m \cdot UI) \quad \text{Eqn. 21}$$

The term $E[\psi_{\tau\tau}(m)]$ is the expected autocorrelation sequence. $E[\psi_{\tau\tau}(m)]$ is periodic term with frequency of $\omega_1$, which will manifest itself as a peak in PSD.

The term $\psi_{sn}(m)$ in Eqn. 21 will tend to zero if $n_i$'s are selected randomly (no correlation between $\omega_1$ and $n_i$ sequence). However, due to limited number of sample, this term will have variations, which will show up as increased noise floor in PSD. This synthetics noise floor is proportional to the amplitude of the deterministic jitter (A).

Random noises due to statistical operation can result in sharp variation in PSD, which at times can result in detection of false periodic jitter peaks. To avoid detection of noise floor peaks as PJ, further smoothing of PSD is needed. There are two ways to do so:

1. Increase the number of samples used to estimate autocorrelation for each lag value ($M_m$). This results in more averaging of noise term in Eqn. 19, which reduces the noise floor power, but it does not reduce the PSD noise floor variations.
2. Compute PSD K times and average the results. This may be done in two different ways:
    a. Take samples with time intervals that span a·UI to b·UI. Take $M_m = M$ samples for each UI span. Compute PSD. Repeat the process K times to obtain K estimates of PSD.
    b. Take samples with time intervals that span a·UI to c·UI, where $c = a + (1 + (K-1)/2) \cdot b$. Compute $\psi_{\tau\tau}(m)$ for $m = a, \ldots, c$ and interpolate the missing points. Divide the interpolated $\psi_{\tau\tau}(m)$ record to K section that overlap each other by 50%; each section will have $N_A = (b - a + 1)$ samples. Compute PSD for each section and average the resulting PSD estimates.

For random $n_i$, the first method reduces the noise floor power by $\sqrt{\alpha}$ when $N_A$ is increased by a factor of $\alpha$. The second method only smoothes the noise floor to avoid detection of locally generated peaks. In cases that it is not possible to ensure total randomness of $n_i$ sequence due to specific pattern selection, partitioning data to a number of overlapped sections may result in better smoothing of noise floor because it avoids taking samples of the same UI spans in each of the K PSD estimates. FIGS. 5a-5c illustrate the effect of PSD averaging using sequence partitioning. FIG. 5a shows that noise floor variations decreased significantly over the whole PSD frequency range, while FIGS. 5b and 5c zooms specific frequency ranges to show that the averaging process smoothes the noise floor, but maintains the valid PJ peaks. Plot (c) also shows a wider main lobe at PJ frequency and smaller frequency resolution due to reduced sequence size after sequence partitioning. The smoothed PSD is denoted by $\Psi(\omega)$. Each of the FIGS. 5a-5c illustrate three levels of signal averaging. As most clearly seen in FIG. 5c, trace 500 represents no averaging, trace 502 represents averaging with K=3 and trace 504 represents averaging with K=5.

PSD illustrates jitter frequency components within a finite frequency range and with a limited frequency resolution. Frequency resolution is a function of autocorrelation sequence length and windowing function. The maximum frequency is set by the separation between adjacent autocorrelation points, while minimum is set by frequency resolution. In other words:

$$f_r = \frac{1}{N_D \cdot J_u \cdot UI \cdot \alpha_w} \quad \text{Eqn. 22}$$

$$f_{min} = \frac{1}{N_D \cdot J_u \cdot UI}$$

$$f_{max} = \frac{1}{J_u \cdot UI}$$

where, $f_r$ is the frequency resolution, $f_{min}$ and $f_{max}$ are the minimum and maximum points of PSD frequency range, $N_D$ is the length of smoothed PSD, and $J_u \cdot UI$ is the distance between two adjacent points of interpolated autocorrelation function $\psi_{\tau\tau}(m)$. $\alpha_w$ is the windowing related frequency resolution reduction factor, which can be defined as 6 db bandwidth of the windowing sequence FFT. For example, $\alpha_w = 1.9$ for a Kaiser window with parameter $\beta = 5.6$.

The PSD computed previously is symmetric around its middle point. Therefore, we only use the first half of FFT record, because it contains all information required to estimate PJ. Once PSD is estimated, the significant peaks have to be isolated and estimated to obtain an estimate of PJ. The principle of peak detection is to identify frequency components whose magnitude is significantly larger than their surrounding noise floor. However, the performance of such filters depends on the filter parameters in relation to PSD composition. A robust and flexible estimation method is to use sliding window square root correlator (SWSQ).

A sliding window square root correlator (SWSQ) filter computes RMS magnitude of the PSD under a narrow PJ window relative to the average value of PSD magnitude within a larger local noise floor (LNF) window surrounding the narrow window. This filter essentially attenuates the areas of low variations while amplifying the PJ peaks that are distinctly above its surrounding noise floor. This method is described in more details in "Peak detection algorithm" section.

FIGS. 6a-6c show that SWSQ filtering attenuates the noise floor and amplifies the peaks, which are lager than their surrounding noise floor. FIGS. 6b and 6c zoom the plot of FIG. 6a to illustrate the SWSQ filter behaviour more closely. As expected, only two peaks are detected, one at 5 MHz and another at 23.4 MHz.

The detected PSD peaks ($i_{pk}(l)$, $\Psi(i_{pk}(l))$) may include the following components: periodic jitter including asynchronous components and harmonically-related components, Data-dependent jitter (DDJ).

DDJ source is primarily inter-symbol interference (ISI) and is totally correlated with the bit pattern in the data stream. In many test condition, a finite length pattern is repeated within the data stream to exercise the performance of device under test (DUT). Due to the periodic repetition of the bit pattern, DDJ manifests itself as periodic jitter. The sampling methodology described in Section 1 does not cancel DDJ before estimation of autocorrelation sequence, which leads to DDJ-related PJ components. Therefore, DDJ must be eliminated from the list of detected peaks.

If the periodic pattern length is relatively short (<200), DDJ will appear as spectral lines at frequencies that are harmonics of pattern rate, $f_{pat}$ (the rate of pattern repetition), which is computed as below:

$$f_{pat} = \frac{f_d}{patLen} \qquad \text{Eqn. 23}$$

where, $f_d$ is the data rate, and patLen is the pattern length in UI. For example, if the pattern is K28.5 with patLen=20, and the data rate is 2 Gbps, the pattern rate is 100 MHz. Therefore, any PJ component at $k \cdot f_{pat}$, k=1, . . . , patLen, will have to be deleted from the list of the peaks. Exception to the rule is when a valid PJ component occurs at one of the DDJ harmonics. In such case, PJ will not be detectable if it is small relative to other DDJ spectral lines (or DDJ estimated from time domain method). If PJ is much larger that the estimated DDJ, it can be consider PJ and accept some estimation error due to interference of the DDJ harmonic.

In many applications, the importance of PJ components varies depending on their frequencies. For example, SONET standards specify masks for intrinsic jitter and jitter transfer. Serial IO standards, e.g., FiberChannel, often specify a filter mask that should be applied to the PJ components before computing total peak-to-peak jitter. This mask attenuates the contribution of low frequency jitter because the PLL in the receiver clock recovery circuit compensates for them; hence, they do not affect BER significantly. For serial IO standards, this filter, sometimes referred to as Golden PLL characteristic, is a high-pass filter with a single pole at frequency of bit-rate divided by 1667.

After elimination of DDJ-related components, the remaining components are considered valid PJ peaks, which contribute to peak-to-peak PJ. From Eqn. 21, the $\Psi(i_{pk})$ and the PJ amplitude at $i_{pk}(l)$, $A(l)$, are related as below:

$$\Psi(i_{pk}(l)) = A(l)^2/4 \Rightarrow A(l) = 2\sqrt{\Psi(i_{pk}(l))} \qquad \text{Eqn. 24}$$

When the frequencies of the peaks are not harmonically related, the total peak-to-peak PJ is computed by adding the peak-to-peak value of all the PJ components:

$$PJ_{pk\text{-}pk} = 4\sum_{l=1}^{M_{pk}} \sqrt{\Psi(i_{pk}(l))} \qquad \text{Eqn. 25}$$

If some of the peak frequencies are harmonically related, simply adding the peak-to-peak value of all PJ components is not accurate anymore. Assume the jitter signal includes two PJ components, such that one is the n-th harmonic of the other one. For such cases, the peak-to-peak value depends not only on the amplitudes of the harmonics, but also on their relative phases. FIG. 7 shows how the total peak-to-peak PJ varies versus n. Sweeping the relative phases of the two harmonics for each value of n yields the maximum 700 and minimum 702 curves. The PSD, however, does not include phase information, which prevents estimation of a unique and accurate estimate of peak-to-peak PJ.

A solution is to use the worst-case peak-to-peak estimate by sweeping the harmonics relative phase for the estimated amplitudes and n from PSD. This will yield a pessimistic PJ estimate, which will minimize test escape (bad device that pass the test) in production test applications, at the expense of reduced test yield (percentage of all good devices that pass the test). Once the peak-to-peak amplitudes are computed for harmonically related components, the result can be added to the peak-to-peak of other asynchronous components.

The following indicates the performance of the PJ detection algorithm for a variety of simulated data streams with different jitter profile.

Table 1 shows the PJ measurement results using N-variance method. Time interval spans from 2 to 7200 UI are measured, and 128 samples in average are measured for each span value ($M_m$=128). The reported results show that the N-variance method provides accurate results, except in cases that PJ too small to be distinguishable from noise floor. Such cases specially occur when DDJ is large relative to PJ, because DDJ appears as periodic components that produce synthetic noise floor.

TABLE 1

| | PJ measurement simulation results. Bit-rate = 2 Gbps, pattern = K28.5, PJ frequency = 4 MHz, $M_m$ = 128 and $M_m$ = 60 | | | | | | | |
|---|---|---|---|---|---|---|---|---|
| | PJ injected (ps) | RJ ($\sigma_{RJ}$) = 0 ps, DDJ (pp) = 0 ps | RJ ($\sigma_{RJ}$) = 2 ps, DDJ (pp) = 0 ps | RJ ($\sigma_{RJ}$) = 4 ps, DDJ (pp) = 0 ps | RJ ($\sigma_{RJ}$) = 10 ps, DDJ (pp) = 0 ps | RJ ($\sigma_{RJ}$) = 2 ps, DDJ (pp) = 30 ps | RJ ($\sigma_{RJ}$) = 4 ps, DDJ (pp) = 30 ps | RJ ($\sigma_{RJ}$) = 10 ps, DDJ (pp) = 30 ps |
| $M_m$ = 128 | 2 | 2.002 | 2.016 | 2.39 | 0* | 0* | 0* | 0* |
| $M_m$ = 60 | | 1.996 | 1.96 | 0* | 0* | 0* | 0* | 0* |
| $M_m$ = 128 | 4 | 4.002 | 4.015 | 4.06 | 0* | 4.1 | 0* | 0* |

TABLE 1-continued

PJ measurement simulation results. Bit-rate = 2 Gbps, pattern = K28.5,
PJ frequency = 4 MHz, $M_m$ = 128 and $M_m$ = 60

| | PJ injected (ps) | RJ ($\sigma_{RJ}$) = 0 ps, DDJ (pp) = 0 ps | RJ ($\sigma_{RJ}$) = 2 ps, DDJ (pp) = 0 ps | RJ ($\sigma_{RJ}$) = 4 ps, DDJ (pp) = 0 ps | RJ ($\sigma_{RJ}$) = 10 ps, DDJ (pp) = 0 ps | RJ ($\sigma_{RJ}$) = 2 ps, DDJ (pp) = 30 ps | RJ ($\sigma_{RJ}$) = 4 ps, DDJ (pp) = 30 ps | RJ ($\sigma_{RJ}$) = 10 ps, DDJ (pp) = 30 ps |
|---|---|---|---|---|---|---|---|---|
| $M_m$ = 60 | | 3.992 | 3.97 | 4.16 | 0* | 0* | 0* | 0* |
| $M_m$ = 128 | 16 | 15.999 | 15.95 | 15.98 | 15.94 | 16.14 | 16 | 16.2 |
| $M_m$ = 60 | | 16.04 | 16 | 16.08 | 16.42 | 15.82 | 16.04 | 15.98 |
| $M_m$ = 128 | 30 | 29.994 | 29.94 | 30 | 30 | 30.02 | 29.9 | 30.2 |
| $M_m$ = 60 | | 29.9 | 29.94 | 30.08 | 30.16 | 29.92 | 30.28 | 30.62 |
| $M_m$ = 128 | 50 | 50.07 | 49.83 | 49.92 | 50 | 50.2 | 49.86 | 50.1 |
| $M_m$ = 60 | | 49.84 | 50.05 | 50.08 | 50.08 | 50.52 | 49.86 | 49.7 |
| $M_m$ = 128 | 80 | 79.9 | 79.98 | 79.96 | 79.9 | 80.1 | 79.92 | 80.02 |
| $M_m$ = 60 | | 79.9 | 79.6 | 80.66 | 79.6 | 79.6 | 80.07 | 79.88 |
| $M_m$ = 128 | 120 | 119.94 | 119.83 | 120.01 | 120 | 119.76 | 119.6 | 120.2 |
| $M_m$ = 60 | | 119.96 | 120.08 | 120.33 | 119.6 | 120.2 | 119.7 | 119.93 |

*PJ peak is not distinguishable from Noise floor

Simulations also show that with $M_m$=60 accurate results can still be obtained.

Post-Measurement Pattern Matching Algorithm

In many serial IO test schemes, a pattern is repeated to test different specifications of the IO. In such cases, pattern synchronization often is required to match the edges in a data stream to specific edges in the data pattern. Pattern synchronization provides sufficient information to compute the bit interval difference between data stream edges from the event (rising and/or falling edges) count numbers relative to a reference edge in the data stream.

One method of pattern matching is to minimize the RMS difference between the measured time interval and expected time ones with different starting edge assumptions. The description of general algorithm follows.

Assume that the i-th edge in the pattern is the sampling start edge of the data stream. Using this start edge, form a sequence of expected time intervals, $Px_i$, from the rising edge count number relative to the start edge, and the time interval UI span. For each value of i from 0 to the maximum number of rising edges in the pattern, pat_rise, create the associated $Px_i$. Compute the RMS difference between measured $P_i$ sequence and expected ones:

$$Z = \overline{[(Px_i - P)^2]} \qquad \text{Eqn. 26}$$

where P is the measured time interval sequence. Find i that minimizes the cost function Z. In general, $Px_i$ (i=0, . . . , pat_rise) may be very long sequence, and also pat_rise may be a large number for long patterns, which result in significant amount of computation required for obtaining the synchronization. An alternative is to form only partial $PX_i$ sequences, for example first 100 elements. This will reduce the computational load significantly. More implementation details are given in the "Pattern Synchronization" section below.

Estimating Peak-to-Peak High Frequency Periodic Jitter

The following describes how to estimate peak-to-peak high frequency periodic jitter (PJ). The algorithm computes statistical autocorrelation function from the time interval error (TIE) estimates, and uses Fast Fourier Transform (FFT) to isolate high-frequency PJ peaks. This method enables elimination of DDJ from the TIE, which eliminates many spurious peaks in frequency domain enabling detection of PJ components with better accuracy and reliability.

It is assumed that data is available in the following format:

| | |
|---|---|
| $EB_1$ = {E(1, 1), E(1, 2), ..., E(1, L)} <br> $EB_2$ = {E(2, 1), E(2, 2), ..., E(2, L)} <br> $EB_m$ = {E(M, 1), E(M, 2), ..., E(M, L)} | Event numbers |
| $tB_1$ = {t(1, 1), t(1, 2), ..., t(1, L)} <br> $tB_2$ = {t(2, 1), t(2, 2), ..., t(2, L)} <br> $tB_M$ = {t(M, 1), t(M, 2), ..., t(M, L)} | time tags |
| $pB_1$ = {p(1, 1), p(1, 2), ..., p(1, L)} <br> $pB_2$ = {p(2, 1), p(2, 2), ..., p(2, L)} <br> $pB_M$ = {p(M, 1), p(M, 2), ..., p(M, L)} | pulse or interval widths | where [$EB_i$, $tB_i$, $pB_i$] represents the i-th block of data whose p(i,1), . . . p(i,L) element spans 1 to L pulses, L is the number of samples in a block, and M is the number of blocks. Selection of L depends on the desired PJ frequency range, the pattern, and FFT processing parameters.

| | |
|---|---|
| patLen: | Pattern length in bits or UI |
| ppat : | Number of pulses in the pattern. This is the same as the number of rising or falling edges in the pattern. |
| UI: | Average UI interval |
| $UI_{nominal}$: | Nominal UI defined by the user |
| $T_{samp}$: | Average time interval sampling period. |
| TIE | Time interval error. Each time tag yields a TIE by subtracting its value from the equivalent ideal clock cycles. |
| $E_{ST}$ (i, k) | The number of events (rising edge) between the START edge of the i-th sample and the first START edge in the k-th block. |
| $E_{SP}$ (i,k) | The number of events (rising edge) between the STOP edge of the i-th sample and the first START edge in the k-th block. |
| $b_{ST}$ (i, k) | The number of bits between the START edge of the i-th sample and the first START edge in the k-th block. |
| $b_{SP}$ (i,k) | The number of bits between the STOP edge of the i-th sample and the first START edge in the k-th block. |

Direct Autocorrelation (AC) PJ Estimation Method

For this algorithm, notations and assumption listed above apply. Signal under test can be data stream or clock.

For detecting PJ from direct AC function, it is preferred to randomize the start sampling time of different time intervals relative to each other. Lack of sufficient randomization may leads to erroneous PJ components. The following describes a time interval sampling method that can be implemented in GuideTech GT4000 CTIA with pseudo-random arming feature, which is implemented as linear feedback shift register (LFSR).

The samples are taken in M blocks. Each block contains L time interval samples. Within each block, the LFSR arming mode must be used. This mode ensures that the event difference from the start of one time interval sample to the next follows a pseudo-random pattern.

The pseudo-random arming results in a sequence of event increment within one block, $E_{pr}(i)$, i=1, ..., L, are defined as below:

$$E_{pr}(i,j)=E(i+1,j)-E(i,j)=EC+LFSRm(i)$$

$$i=1, \ldots, L \text{ and } j=1, \ldots, M \qquad \text{Eqn. 27}$$

where, EC is the constant offset and LFSRm(i) is the pseudo-random sequence.

User Defined Parameters

A number of features are necessary to facilitate the complete test and fine-tune of algorithms without much interference with core software. These features should be implemented in the software. They are listed below:

User Defined (Preferable Accessible through GT Driver for GPIB Access):
  Event increment offset (EC)
  LFSR polynomial,
  LFSR seed,
  LFSR mask,
  Number of samples per block,
  Number of blocks
  Number of block in each group (for PSD averaging)

1. Estimate ideal UI for every block. To do so without the need for synchronization, compute UI for each block:
   a. Find two measurements in one block such that the difference between their start events is a multiple of pattern pulses (ppat). Denote these sample indices within j-th block with $u_{1,j}$ and $u_{2,j}$. These sample can be found in two ways, as follows:
      i. Compute the remainder of each start event to ppat. Choose two samples whose remainders are the same.
      ii. Compute the remainder of the accumulative LFSR event increment sequence, $$E_{prc}(i) = \sum_{k=1}^{i} E_{pr}(k),$$

to the ppat. Choose two $E_{prc}(i)$ elements whose remainders ppat are the same to obtain $u_{1,j}$ and $u_{2,j}$. This can be done before the measurement starts and save $u_{1,j}$ and $u_{2,j}$ for later use.
   This procedure results in one pair of $[u_{1,j}, u_{2,j}]$ for each block (L pairs in total). In predictable arming scenarios, $u_{1,j}$ and $u_{2,j}$ are the same for all blocks.
   b. Compute UI estimate for each block from the $u_{1,j}$ & $u_{2,j}$ pairs:

$$UI(j) = \frac{t(j, u_{2,j}) - t(j, u_{1,j})}{E(j, u_{2,j}) - E(j, u_{1,j})} \frac{ppat}{patLen} \qquad \text{Eqn. 28}$$

$$j = 1, \ldots, M$$

Now, a single estimate of UI can be computed by averaging the UI(j) vector:

$$UI = \frac{1}{M} \sum_{j=1}^{M} UI(j) \qquad \text{Eqn. 29}$$

2. Block pattern synchronization:
   The direct AC requires the TIE sequences for both the START and STOP edges of the sampled time intervals. To compute the TIE sequences, the number of bits between each START/STOP edge and the beginning of the block has to be extracted. Two methods are possible:
   a. Method 1
      Estimate the number of UIs from the beginning of the block to the START/STOP edges:

$$b_{ST}(i, k) = \frac{t(i, k)}{UI} \qquad \text{Eqn. 30}$$

$$b_{SP}(i, k) = \frac{t(i, k) + p(i, k)}{UI}$$

These estimates, however, are only valid if the edge jitter is less than 0.5UI. This condition may not be valid in all cases, especially in the presence of low frequency jitter.
   b. Method 2
      Use the correlation between the time intervals and event number to synchronize the acquired data with the pattern file. A general form of this algorithm is described in below in the section on Pattern Synchronization. This method not only provides $b_{ST}(i,k)$ and $b_{SP}(i,k)$, it also determines which pattern edge is the block starting edge, Eref(k). This function acts as a pattern marker, which helps to separate jitter for each pattern edge to estimate DDJ or RJ from randomly collected data sets.

$$b_{ST}(i,k)=[(E_{ST}(i,k)+Eref(k))/ppat]*patLen+riseBitLoc_p \\ (\text{mod}(E_{ST}(i,k)+Eref(k),ppat)) \qquad \text{Eqn. 31}$$

$$b_{SP}(i,k)=[(E_{SP}(i,k)+Eref(k))/ppat]*patLen+riseBit-\\ Loc_p(\text{mod}(E_{SP}(i,k)+Eref(k),ppat)) \qquad \text{Eqn. 32}$$

where riseBitLoc$_p$ is defined in the Pattern Synchronization section below.
   Method 2 is the preferred one.

3. Compute the best LMS fit UI estimate for each block ($UI_b(k)$):

$$UI_b(k) = \frac{L \cdot \left[\sum_{i=1}^{L} b_{ST}(i, k) \cdot t(i, k)\right] - \left[\sum_{i=1}^{L} b_{ST}(i, k)\right]\left[\sum_{i=1}^{L} t(i, k)\right]}{L \cdot \left[\sum_{i=1}^{L} (b_{ST}(i, k))^2\right] - \left[\sum_{i=1}^{L} b_{ST}(i, k)\right]^2} \qquad \text{Eqn. 33}$$

This estimate does not suffer from residual error that can manifest as long term drift in TIE sequence in the presence of low frequency jitter. A subset of samples between i=1, ..., L will also provide accurate results. It is recommended to select only 40 samples as below:

$$i=1,[L/40],[L/40]+1,\ldots,L \qquad \text{Eqn. 34}$$

Computation estimate: This step requires ($2L_e+4$) multiplications and ($5L_e+2$) additions, where $L_e=40$ is the number of samples used for UI estimation in each block. Assuming addition and multiplications take one DSP clock cycle to execute, total required cycles will be (($7L_e+6$)M=286M).

4. Compute TIE sequence for all START and STOP edges as below:

$$TIE_{ST}(i,k)=t(i,k)-b_{ST}(i,k)*UI_b(k)$$

$$TIE_{SP}(i,k)=t(i,k)+p(i,k)-b_{SP}(i,k)*UI_b(k) \qquad \text{Eqn. 35}$$

5. Remove the average for TIE in each block:

$$TIE_{ST}(i,k) = TIE_{ST}(i,k) - \frac{1}{L}\sum_{i=1}^{L} TIE_{ST}(i,k) \qquad \text{Eqn. 36}$$

$$TIE_{SP}(i,k) = TIE_{SP}(i,k) - \frac{1}{L}\sum_{i=1}^{L} TIE_{SP}(i,k)$$

6. Compute the DDJ related edge shift for each pattern edge:
   a. Add the pattern edge index for the block start edge to the START and STOP events for that block to synchronize each block event sequence with the pattern. Find the remainder of the resulting synchronized event sequences to ppat:

$$R_{ST}(i,k) = \text{rem}(E_{ST}(i,k) + E_{ref}(k), ppat)$$

$$R_{SP}(i,k) = \text{rem}(E_{SP}(i,k) + E_{ref}(k), ppat) \qquad \text{Eqn. 37}$$

b. Find edges that are repetitions of the same pattern edge by classify the measured edges based on their $R_{ST}(i,k)$ and $R_{SP}(i,k)$. Find the mean of TIE estimate for the edges with the same $R_{ST}(i,k)$ or $R_{SP}(i,k)$.

```
for k = 1:M                                          Eqn. 38
   for i = 1:L
      for r = 1:ppat
         if R_ST(i,k) = r
            DDJ(r) = DDJ(r) + TIE_ST(i,k)
            M(r) = M(r) + 1
         end
         if R_SP(i,k) = r
            DDJ(r) = DDJ(r) + TIE_SP(i,k)
            M(r) = M(r) + 1
         end
      end
   end
end DDJ(r) = DDJ(r) / M(r)
```

7. Eliminate DDJ:

```
for k = 1:M                                          Eqn. 39
   for i = 1:L
      for r = 1:ppat
         if R_ST(i,k) = r
            TIE0_ST(r) = TIE_ST(i,k) - DDJ(r)
         end
         if R_SP(i,k) = r
            TIE0_SP(r) = TIE_SP(i,k) - DDJ(r)
         end
      end
   end
end
```

Eliminating DDJ prevents DDJ-related frequency components from appearing in FFT sequence. This greatly improves the accuracy of PJ peak detections.

8. Compute the UI span for each time interval sample:

$$n(i,k) = b_{SP}(i,k) - b_{ST}(i,k) \qquad \text{Eqn. 40}$$

9. Divide the blocks to $M_A$ groups, such that there is 50% overlap between the blocks in each group. This will result in $M_A$ groups, each containing $M/((M_A+1)/2)$ blocks. For example, with 80 block and 4 groups, each group will contain 32 blocks, as below:
   Group 1: block 1 to 32
   Group 2: block 17 to 48
   Group 3: block 33 to 64
   Group 4: block 49 to 80

10. Compute jitter power spectral density estimates from the samples in each group as follows:
    a. Sort the samples of all blocks of the group in bins, such that $n(i,k) = n(j,l)$ in each bin. In other words, each bin will contain samples with the same UI span. The binning process generates $N_b$ bins. The u-th bin contains time intervals $T(u,v)$, $v=1, \ldots, V_u$, with UI span of $n_s(u)$, where $V_u$ is the number of elements in the bin.
    b. Compute the direct AC function from below:

$$\gamma_s(u) = \frac{1}{V_u}\sum_{v=1}^{V_u} (TIE0_{ST}(u,v) \cdot TIE0_{SP}(u,v)) \qquad \text{Eqn. 41}$$

for $u = 1, \ldots, N_b$ $\gamma_s(u)$ is an approximation to jitter autocorrelation function:

$$\gamma_s(u) = \psi(u) + e(u) \text{ for } u=1, \ldots, N_b \qquad \text{Eqn. 42}$$

c. where, $\psi(u)$ is the autocorrelation function and $e(u)$ is a error term that contribute to the noise floor (it is ignored in practical situations).
    d. If minimum UI span bin is less than 4 ($\min[n(u)] < 4$), then add $\gamma_s(0) = 0$ to $\gamma_s(u)$ vector. Otherwise, continue to step 4e.
    e. Test whether $n_s(u)$ follows a uniform increment, e.g., UI or 2UI. If so, continue with step 11. If not, find a multiple UI for which most members of $n(u)$ belong to. Create a uniform sample index vector $n(l) = J \cdot l$, where J is a constant number (most likely 1 or 2). For values of $n(l)$ that do not match any value in $n_s(u)$, interpolate the missing samples:

$$\gamma(l) = \text{interpolate}(n_s(u), \gamma_s(u), l) \qquad \text{Eqn. 43}$$

Use linear interpolation by estimating any missing sample by linear estimation between the adjacent samples. $\gamma(l)$ has N elements.
    f. If the condition $\min[n(u)] < 4$ is true, create a mirror vector and append it to $\gamma(l)$:

$$\gamma_m(-l) = \gamma_m(l) = \gamma(l) \text{ for } k=0, \ldots, N \qquad \text{Eqn. 44}$$

where, $\gamma_m(l)$ is the mirrored N-variance function with the length of $N_c = 2N+1$. If the condition $\min[n(u)] < 4$ is false, set $\gamma_m(l) = \gamma(l)$ and continue to step 8. In this case, $\gamma_m(l)$ has $N_c = N$ elements.
    g. Let $\gamma_r(l) = \gamma_m(l)$ for the r-th group ($r=1, \ldots, M_A$), where its length is $N_c(r)$.

11. Truncate each sequence $\gamma_r(l)$ such that the length of each autocorrelation sequence is the equal to the length of the shortest sequence:

$$\text{length}(\gamma_r(l)) = \min(N_c(r))|_{r=1, \ldots, M_A} = N_A \text{ for } r=1, \ldots, M_A.$$

12. Compute average PSD. The average PSD has much smoother noise floor, which greatly improves PJ estimation. Perform following steps to compute average PSD:
    a. Form a windowing function to be used for FFT. Kaiser window is the appropriate windowing function for this application. Kaiser window is defined as below:

$$w_k(k) = \begin{cases} \dfrac{I_0[\beta(1-[(k-\alpha)/\alpha]^2)^{1/2}]}{I_0(\beta)} & 0 \le k \le N_A - 1 \\ 0, & \text{otherwise} \end{cases} \qquad \text{Eqn. 45}$$

where $\alpha=(N_A-1)/2$, $\beta$ is the window parameter, and $I_0(.)$ is the zeroth-order modified Bessel function of the first kind. Set $\beta=5.6$. In practical implementation, it may be advantageous to save the elements of $w_k(k)$ in a memory for a fixed length of $N_A$.

b. For every autocorrelation sequence ($\gamma_r$, $r=1, \ldots, M_A$), compute factor $k_{1,r}$ and $k_{2,r}$ constants, which are used to compensate the distortion close to DC, and scale the PJ peaks for windowing loss, respectively:

$$k_{1,r} = \frac{\sum_{k=1}^{N_C} w_k(k)\gamma(k)}{\sum_{k=1}^{N_C} w_k(k)} \quad \text{Eqn. 46}$$

$$k_{2,r} = \frac{N_A}{\max(|FFT(w_k(k))|)} \quad \text{Eqn. 47}$$

The denominator and $k_{2,r}$ can be pre-computed for set values of $\beta$ and $N_A$ to avoid additional computation.

c. Compute the windowed and scaled N-variance function as below:

$$\gamma_{w,r}(k) = w_k(k)(\gamma_r(k) - k_{1,r})k_{2,r} \quad \text{Eqn. 48}$$

For faster implementation, the factor $k_{2,r}$ does not need to be applied here. Instead it needs to be applied to valid detected PJ peaks at the end of PJ estimation process.

d. Compute the power spectral density function for each $\gamma_{w,r}$, $r=M_A$:

$$\Psi_{w,r} = \text{mag}(fft(\gamma_{w,r}(k), N_{AO})) \quad \text{Eqn. 49}$$

where, $N_{AO}$ is the FFT length. Noting that the number of $\gamma_{w,r}(k)$ elements is $N_A$, select $N_{AO}=2^b$, such that $N_{AO}>2N_A$. Before performing FFT, $\gamma_{w,r}(k)$ has to be padded with zeros to extend its length to $N_{AO}$. Selecting $N_{AO}$ to be a power of 2 improves computational efficiency of FFT algorithm. Zero padding effectively interpolates the FFT, which yields better estimate of maximum peaks. $\Psi_{w,r}$ includes images frequencies, in other words, the second half of the $\Psi_{w,r}$ is the mirror of the first half. Therefore, to reduce peak detection computation, the first half of $\Psi_{w,r}$ samples is saved in $\Psi_r$ and used later for PJ detection:

$$\Psi_r(i) = \Psi_{w,r}(i) \; i=0, \ldots, N_{AO}/2-1 \quad \text{Eqn. 50}$$

e. Compute average PSD ($\Psi$):

$$\Psi_{av} = \frac{1}{M_A} \sum_{r=0}^{M_A-1} \Psi_r \quad \text{Eqn. 51}$$

The average PSD function reduces the noise variations, which avoids detection of small peaks close to noise floor.

f. Use a peak detection algorithm to estimate the PJ peaks in each PSD sequence $\Psi_r$ ($r=1, \ldots, M_A$). This results in multiple pairs of <bin number, amplitude> for each $\Psi_r$:

$$\Psi_r: \{(b_1, amp_1), \ldots, (b_{h_r}, amp_{h_r})\} \quad \text{Eqn. 52}$$

g. Detect peak bin numbers that occur in all $M_A$ PSD sequences $\Psi_r$ ($r=1, \ldots, M_A$). Such peaks are deemed to be valid PJ peaks because they happen consistently in all PSD sequences. To detect common peaks, follow these steps:

i. Search for bin numbers whose difference from bin numbers in other PSD sequences is 0 or 1. This results in clusters of bin numbers, where each cluster contains the bin numbers from different PSD sequences that are within 1 bin of each other.

ii. Count the number of bins in each cluster. Declare the minimum bin number in clusters with $M_A$ element as PJ peaks.

h. Use the heuristic above to separate valid PJ peaks from spurious and DDJ peaks.

PJ Peak Estimation

The peak estimation algorithm is based on a relative RMS criteria. In this approach, any area under a sliding widow whose RMS value under the PSD is larger than a percentage of total RMS value under the curve is declared as a significant periodic jitter peak. Periodic jitter components include data-dependent ones for repetitive pattern data streams, and PJ harmonics.

The following describes how to detect significant periodic jitter peaks and separate valid PJs from them.

Peak Detection Algorithm

The peak detector algorithm is based on the calculation of the relative spectrum RMS power under a sliding rectangular window. The width of the window (cwidth) is a function of Kaiser window parameter $\beta$ and Zero-padded N-variance function length $N_{AO}$. Following steps describe how to detect peaks in $\Psi$ array (assume $N_{c0}=N_{AO}$):

1. Form the following relative rms power array (relative_rms) by sliding the centre of the rectangular window of width cwidth on $N_{c0}/2$ bins:

$$\text{relative\_rms}(i) = \sqrt{\sum_{j=i-cwidth/2}^{i+cwidth/2} [s(j) \cdot (\Psi(j) - \Psi^w_{avg}(i))^2]} \quad \text{Eqn. 53}$$

$$i = 1 + \left[\frac{cwidth}{2}\right], \ldots, \frac{N_{c0}}{2} - \left[\frac{cwidth}{2}\right]$$

$$\Psi^w_{avg}(i) = \begin{cases} \eta_{NF} \cdot \text{mean}(\Psi(k)|_{k=0,\ldots,i+(W_{avg}/2)-1}) & i \leq W_{avg}/2 \\ \eta_{NF} \cdot \text{mean}(\Psi(k)|_{k=i-(W_{avg}/2),\ldots,i+(W_{avg}/2)-1}) & i > W_{avg}/2 \end{cases}$$

$$s(j) = \begin{cases} 1 & \Psi(j) - \Psi^w_{avg}(i) > 0 \\ 0 & \Psi(j) - \Psi^w_{avg}(i) \leq 0 \end{cases}$$

$$W_{avg} = \left[\frac{N_{c0}}{N_{avg}}\right]$$

where i is the sweeping index in the frequency domain, [X] represent the integer part of the number X, and $N_{avg}=200$. The factor $s(j)$ avoids detection of minima instead of maxima, and $\eta_{NF}$ is the noise floor rejection coefficient, which can be adjusted to reject small peaks in noise floor. The relative_rms is a "very smooth" function that has easy to detect local maxima at $\Psi$ peaks. The factors $s(j)$, $\eta_{NF}$, and $N_{avg}$ provide the flexibility to fine-tune the performance of the algorithm easily.

2. Cancel the noise floor by forcing the elements of relative_rms with rms value less than 4 times the average of $\Psi$ to zero:

$$\text{relative\_rms}(k)=0 \text{ if relative\_rms}(k)<4\overline{\Psi(i)} \quad \text{Eqn. 54}$$

where $\overline{\Psi}$ is the average of $\Psi(i)$.

3. Next step is to find local maxima, where the difference function of relative_rms crosses zero (changes sign). One method for doing so is as follows:

a. Form the following difference array from relative_rms for all array indices i:

$$\text{diff\_relative\_rms}(i)=\text{relative\_rms}(i+1)-\text{relative\_rms}(i) \quad \text{Eqn. 55}$$

b. Find all indices of diff_relative_rms with greater than zero value (pos_idx)
c. Find the elements of pos_idx that have missing incremental index (hole) on the right and call it max_idx. For example if pos_idx=[10, 11, 12, 25, 26, 27, 50, 51, ...], then max_idx=[12, 27, ...]. max_idx contains the index of the local maximum points or points that are very close to the local maximum in Ψ.
4. Find the frequency and amplitude of the estimated maxima by forming windows of width cwidth with the centre point (index) located at the elements of max_idx and finding the maximum of Ψ in that interval:

For Each j = 1,...,$M_p$ Do                                                  Eqn. 56
Begin
    win_idx = (max_idx(j)−[cwidth/2]...max_idx(j)+[cwidth/2])
    peak_amp(j) = max(Ψ(win_idx))
    peak_idx(j) = index of max(Ψ(win_idx))inΨ
End where $M_p$ is the number of max_idx elements and also the number of significant peaks in frequency domain. peak_idx and peak_amp of size $M_p$ are significant PJ peak index and amplitude in Ψ array.

5. Compute the frequency and amplitude of the peaks from below:

$$f_{peak}(k) = \frac{\text{peak\_idx}(k)}{J \cdot UI \cdot_{c0}} \quad \text{Eqn. 57}$$

$$A_{peak}(k) = 2\sqrt{\text{peak\_amp}(k)}$$

$$k = 1, \ldots, M_p$$

6. Peak detection algorithm is completed
1. DDJ peak identification (Not needed if DDJ is eliminated in time domain):
Identify the peaks that satisfy one of the following conditions:

$$r \cdot f_{pat} - g \cdot f_{res} < f_{peak}(k) < r \cdot f_{pat} + g \cdot f_{res} \quad \text{Eqn. 58}$$

where, $f_{pat} = f_{bit\_rate}/(\text{patLen})$, r=1, ..., patLen/2, and $f_{res} = 1/J \cdot UI \cdot N_{c0}$ is the frequency resolution of the algorithm, and g is a constant factor that depends on FFT windowing and zero-padding parameter. Eliminate any of these peaks that is less that three times their average. The remaining peaks that are harmonics of DDJ are assumed to include significant PJ components and pass through this stage 2. Low pass Golden Filter (GF) masking:
Golden Filter (GF) mask should be applied to the PJ results before computing the final peak-to-peak PJ. This mask basically attenuates the lower frequency components of PJ, because the receiver clock recovery circuit can follow them. The GF mask is modeled as a single pole high-pass filter and is defined with a single parameter, its cutoff frequency. The cutoff frequency is approximately $f_{cutoff} = 1/(1667UI)$ for many serial IO standards, but should be also set as a user-defined parameter. To apply GF mask eliminate low frequencies, scale the computed PJ peaks as follows:

$$PJ(f_i) = \text{peak\_amp}(f_{peak}(i))\left(\frac{f_{peak}(i)}{\sqrt{f_{peak}^2(i) + f_{cutoff}^2}}\right) \quad \text{Eqn. 59}$$

Eliminate the PJ peaks that are harmonics of pattern repetition rate. Such harmonics are due to DDJ and should not be considered in PJ.
3. Estimate peak-to-peak PJ by computing the square root of the sum of the squares of all remaining PJ components. Then multiply the result by 2. This approximation is fairly accurate and insensitive to small perturbations.
4. The peak-to-peak PJ estimate is complete.

Pattern Synchronization

The GuideTech continuous time interval analyzer (CTIA), is able to control the number of events that lapses between two edges whose timing are measured relative to a unique reference. Every measurement includes two time tags, each corresponding to time interval between a START event and an associated STOP event. The difference between START and STOP events can be set in two ways:
1. Pulse width
   a. Positive: START is a rising edge and STOP is the immediately following falling edge
   b. Negative: START is a falling edge and STOP is the immediately following rising edge
2. Time interval: START and STOP are both rising or falling edges with a programmable number of rise/fall events between them.

CTIA, however, does not use a pattern trigger signal in general, which results in a random selection of pattern edge at the beginning of a measurement block. For some measurements, the knowledge of the pattern edge at the beginning of a measurement block can significantly enhance the speed and/or accuracy of measurement, also enabling extraction of more jitter/timing analysis data.

Figure 9:
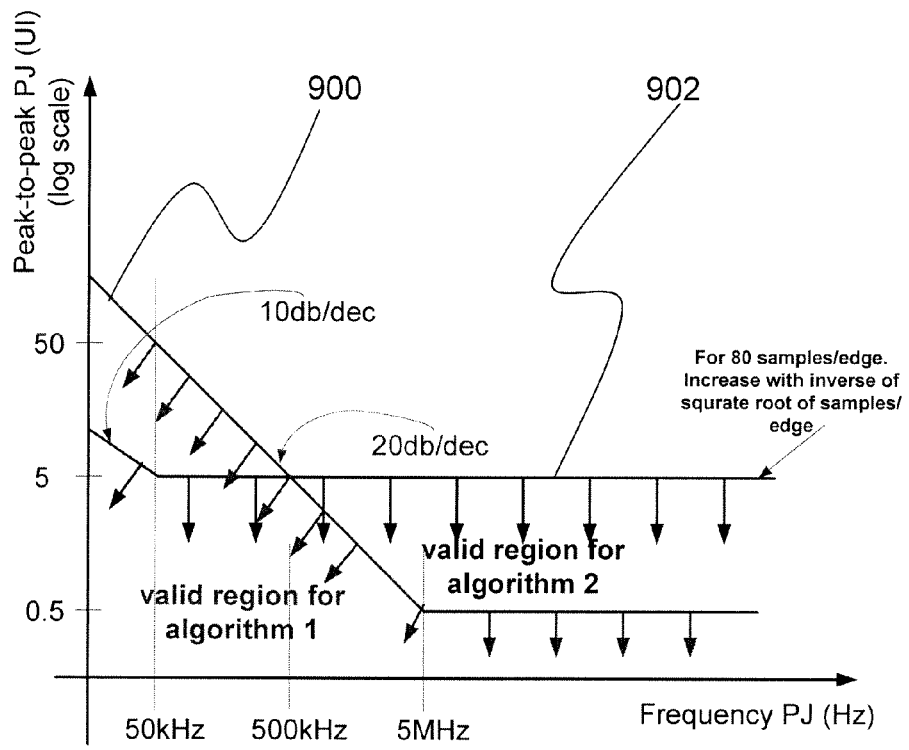
FIG. 9 illustrates valid performance regions for exemplary synchronization algorithms.

Since CTIA tracks the timing and event numbers of all the sampled edges, it is possible to extract the pattern edge at the beginning of the block. The following describes two algorithms to do so in general for a given sequence of START and STOP events and pattern.
1. Time interval difference: This algorithm finds the pattern edge at the start of the block that minimizes the RMS distance between the measured time intervals and expected ones. This method has the following features:
   a. Works well for short patterns, but for longer patterns the likelihood of false synchronization increases in the presence of medium to high frequency PJ.
   b. The method is more sensitive to high frequency PJ than to low frequency ones. It works well for 1UI peak-to-peak PJ at the frequency bit_rate/1000. As PJ frequency deceases, higher PJ amplitudes are tolerable. Line 900 in FIG. 9 shows the acceptable amplitude/frequency region of operation for this algorithm performs.
2. Average PIE difference: This algorithm uses average pattern interval error (PIE) to reduce likelihood of false synchronization in the presence of PJ (effectively averaging out PJ). This method does not show sensitivity to PJ frequency, but its performance deteriorates for PJ with peak-to-peak amplitude of more than 6UI. The valid operation range for this algorithm is shown at line 902 of FIG. 9.
   Note 1: Note that as the number of samples in the block increase, the operation region for this algorithm improves.
   Note 2: For long pattern, the number of sample/edge is small, which results in insufficient PIE averaging. In such scenario, performance of this method becomes closer to the algorithm 1. This is, however, not a problem for PCI-Express with 40-bit pattern.

The best synchronization approach is to use both algorithms 1 and 2 and select the one that provide unambiguous results.

Definitions and Pattern/Data Pre-Processing

Assume a pattern is defined with the array pat as a sequence of 0 and 1 bits. For example, for K28.5 pat={01100000101001111101}. The pattern has $N_e$ rising or falling edges, therefore, the total number of pattern transition edges is $2N_e$. Denote the pattern length with patLen. For K28.5, $N_e$=5, and patLen=20. For a given pat definition, a sequence of edge locations in bits or UI, denoted by edges_ref can be defined relative the first edge, e.g., edgeLoc={0, 2, 7, 8, 9, 10, 12, 17, 18, 19} for the K28.5 pattern defined previously. A measurement block can start with any of the $N_e$ pattern rising edges. The objective of pattern synchronization is to find $p_r$, the pattern edge that the measurement block starts with.

Note: $p_r$ and all other edge locations are defined relative to the first edge of the pattern as defined in pat. Assume L samples are taken for each block.

Figure 8:
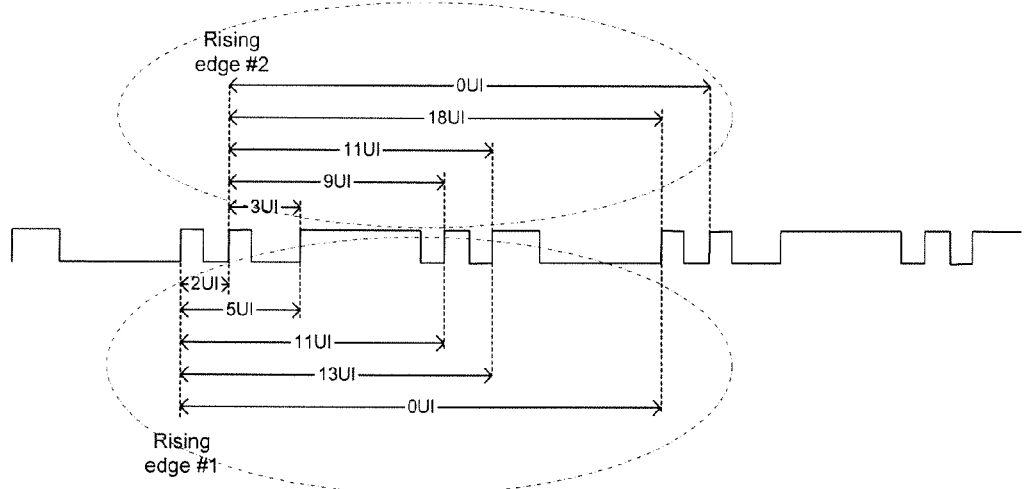
FIG. 8 illustrates a methodology for obtaining the first two rows in an ideal sampling pulse matrix.

Both pattern synchronization algorithms require computing the expected bit location of each edge of the pattern relative to the pattern beginning assuming that the sampled block starts with the p-th pattern edge. This information is extracted as below:

1. Create possible expected START edge location sequence in bits. Use the following steps to do so:
   a. Assume that the measurement block starts with the pattern rising edge number p. This is the data pattern reference edge. Initially set p=1.
   b. Define riseBitLoc array as the location of pattern rising edges relative to the p-th pattern edge (p=1, ..., $N_e$). For example, for p=1, riseBitLoc$_p$={0, 7, 9, 12, 18}. This operation results in a $N_e \times N_e$ matrix, with each row containing the rising edge locations for a different pattern rotation. FIG. 8 shows how the first two rows of such matrix is obtained.
   c. For each p, use the start event numbers to estimate each START edge location relative to the first edge in bits:

$$B_{ST}(p,i)=[(E(i)-E(1))/N_e]*patLen+riseBitLoc_p(\mod((E(i)-E(1)),N_e))$$

i=1, ..., L    Eqn. 60 where [.] represent integer part, riseBitLoc$_p$ is the array of rising edge locations in bits relative to the pattern edge p, and $B_{ST}(p,i)$ is the sequence of expected bit locations for each START edge in the measurement block assuming pattern edge p is sampled at the beginning of the block.

2. Create possible expected STOP edge location sequence in bits. Use the following steps to do so:
   a. In pulse width mode:
      i. For each p define fallBitLoc$_p$ array as the location of pattern edges relative to the p-th pattern rising edge (p=1, ..., $N_e$). For example, for p=1, fallBitLoc$_k$={2, 8, 10, 17, 19}. This operation results in a $N_e \times N_e$ matrix.
      ii. For each k, estimate each STOP edge location relative to the first edge in bits:

$$B_{SP}(p,i)=[(E(i)-E(1))/N_e]*patLen+fallBitLoc_p(\mod((E(i)-E(1)),N_e))$$

i=1, ... L    Eqn. 61 where [.] represent integer part, fallBitLoc$_p$ is the array of falling edge locations in bits relative to the p-th pattern edge, and $B_{SP}(p,i)$ is the sequence of expected bit locations for each STOP edge in the measurement block assuming pattern edge p is sampled at the beginning of the block.

b. In time interval mode:
      Compute the real number of events between START and STOP edges $E_{TI}(i)$.
      i. For each p, estimate each STOP edge location relative to the first edge in bits:

$$B_{SP}(p,i)=[(E(i)+E_{TI}(i)-E(1))/N_e]*patLen+riseBitLoc_p(\mod((E(i)+E_{TI}(i)-E(1)),N_e))$$

i=1, ..., L    Eqn. 62 where [.] represent integer part, riseBitLoc$_p$ is the array of rising edge locations in bits relative to the pattern edge p, and $B_{SP}(k,i)$ is the sequence of expected bit locations for each STOP edge in the measurement block assuming pattern edge p is sampled at the beginning of the block.

"Time Interval Correlation" Pattern Synchronization

1. Select a subset of samples in one measurement block. Choosing K samples such that K=L can provide sufficient information for synchronization, even for long patterns. K should be selected to guarantee unambiguous synchronization, in other words, to guarantee that only one pattern edge is found as the start edge of the data block.
2. For p=1, ... $N_e$:
   a. Generate the expected UI span for the time intervals as follows:

$$B_{TI}(p,i)=B_{SP}(p,i)-B_{ST}(p,i)$$

i=1, ... K    Eqn. 63 b. Compute the mean square of differences between expected edges based on LMS criteria for each k:

$$UI_b(p) = \frac{K \cdot \left[\sum_{i=1}^{K} B_{TI}(p,i) \cdot P(p,i)\right] - \left[\sum_{i=1}^{K} B_{TI}(p,i)\right]\left[\sum_{i=1}^{K} P(p,i)\right]}{K \cdot \left[\sum_{i=1}^{K} B_{TI}(p,i)^2\right] - \left[\sum_{i=1}^{K} B_{TI}(p,i)\right]^2}$$

Eqn. 64

$$P_{offset}(p) = \frac{\left[\sum_{i=1}^{K} B_{TI}(p,i)^2\right]\left[\sum_{i=1}^{K} P(p,i)\right] - \left[\sum_{i=1}^{K} B_{TI}(p,i)\right]\left[\sum_{i=1}^{K} B_{TI}(p,i) \cdot P(p,i)\right]}{K \cdot \left[\sum_{i=1}^{K} B_{TI}(p,i)^2\right] - \left[\sum_{i=1}^{K} B_{TI}(p,i)\right]^2}$$

Eqn. 65

$$C_{PW}(p) = \begin{cases} \frac{1}{K \cdot UI_b(p)} \sum_{i=1}^{K} (B_{TI}(p,i) \cdot UI_b(p) - P_{offset}(p) - P(i))^2 & \text{if } P_{offset}(p) < 0.8 UI_b(p) \\ \frac{1}{K \cdot UI_b(p)} \sum_{i=1}^{K} (B_{TI}(p,i) \cdot UI_b(p) - P(i))^2 & \text{if } P_{offset}(p) > 0.8 UI_b(p) \end{cases}$$

Eqn. 66

3. Find the value of $p_r$ for which the value of $1/C_{PW}(p_r)$ is at least five times larger than any other $1/C_{PW}(j)$, $j \neq p_r$.

$$UI_b(p) = \frac{K \cdot \left[\sum_{i=1}^{K} B_{PIE}(p,i) \cdot PIEm(p,i)\right] - \left[\sum_{i=1}^{K} B_{PIE}(p,i)\right]\left[\sum_{i=1}^{K} PIEm(p,i)\right]}{K \cdot \left[\sum_{i=1}^{K} B_{PIE}(p,i)^2\right] - \left[\sum_{i=1}^{K} B_{PIE}(p,i)\right]^2} \quad \text{Eqn. 72}$$

$$P_{offset}(p) = \frac{\left[\sum_{i=1}^{K} B_{PIE}(p,i)^2\right]\left[\sum_{i=1}^{K} PIEm(p,i)\right] - \left[\sum_{i=1}^{K} B_{PIE}(p,i)\right]\left[\sum_{i=1}^{K} B_{PIE}(p,i) \cdot PIEm(p,i)\right]}{K \cdot \left[\sum_{i=1}^{K} B_{PIE}(p,i)^2\right] - \left[\sum_{i=1}^{K} B_{PIE}(p,i)\right]^2} \quad \text{Eqn. 73}$$

$$C_{PW}(p) = \begin{cases} \frac{1}{K}\sum_{i=1}^{K}(B_{PIE}(p,i) \cdot UI_b(p) - P_{offset}(p) - PIEm(i))^2 & P_{offset}(p) < 0.8 UI_b(p) \\ \frac{1}{K}\sum_{i=1}^{K}(B_{PIE}(p,i) \cdot UI_b(p) - PIEm(i))^2 & P_{offset}(p) > 0.8 UI_b(p) \end{cases} \quad \text{Eqn. 74}$$

4. The $p_r$ obtained form step 6 determines that the $p_r$-th edge in pat is the starting edge of the measurement block.
5. The output of the synchronization algorithm are:

$p_r$ $b_{ST}(i) = B_{ST}(p_r, i)$ $b_{SP}(i) = B_{SP}(p_r, i)$ \hfill Eqn. 67

"Pattern Interval Error (PIE) Averaging" Pattern Synchronization

The following algorithm computes the pattern interval error (PIE) for each edge of the pattern, and averages the PIE for the edges that are repetitions of the same pattern edge. The averaging operation reduces the impact of RJ and PJ on synchronization performance. Subsequently, the averaged pattern PIE sequence is correlated with expected PIE for different block start edge assumptions. The start edge assumption that maximizes these correlations is declared as the valid start edge of the block. The following step describes the algorithm in more detail.

1. For each pattern edge compute the residual of START event number to the number of pattern edges:

$R_{ST}(j) = \mod((E(j) - E(1)), N_e), j = 1, \ldots, L$ \hfill Eqn. 68

This residual can be used to group the sampled edges based on which edge of the pattern they belong to.

2. Compute average PIE (PIEm) for the pattern edges from the sampled START edges:

$PIE_{ST}(m,k) =$ \hfill Eqn. 69

$\left\{\left(T_{ST}(j) - \left\lceil \frac{E(j)-E(1)}{N_e}\right\rceil \cdot patLen * UI\right)_{R_{ST}(j)=m}, j=1,\ldots,L\right\}$ $PIEm(m) = \frac{1}{K(m)}\sum_{k=1}^{K(m)} PIE_{ST}(m,k)$ \hfill Eqn. 70 where $K(m)$ indicates the number of samples corresponding to the m-th edge of the pattern.

3. For $p = 1, \ldots, N_e$:
   a. Generate expected UI span for PIE sequence as follows:

$B_{PIE}(p,m) = \text{riseBitLoc}_p(m)$ $i = 1, \ldots, N_e$ \hfill Eqn. 71 b. Compute the mean square of the differences between expected edges based on LMS criteria for each k:

4. Find the value of $p_r$ for which the value of $1/C_{PW}(p_r)$ is at least three times larger than any other $1/C_{PW}(j)$, $j \neq p_r$.
5. The $p_r$ obtained from step 6 determines that the $p_r$-th edge in pat is the starting edge of the measurement block.
6. The output of the synchronization algorithm are:

$p_r$ $b_{ST}(i) = B_{ST}(p_{r,i})$ $b_{SP}(i) = B_{SP}(p_{r,i})$ \hfill Eqn. 75

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for detecting peaks in a signal pattern containing periodic jitter, comprising the steps of:

electronically sampling a signal pattern using a continuous time interval analyzer;

electronically forming a relative rms power array based on the sampled signal pattern;

electronically canceling the noise floor within the sampled signal pattern;

electronically finding the local maxima within the sampled signal pattern;

electronically finding the frequency and amplitude of the local maxima;

electronically computing the frequency and amplitude of the peak signal; and providing the computed frequency and amplitude of the peak signal as output to a user.

2. The method of claim 1, wherein the step of forming a relative rms power array comprises windowing the sampled signal pattern.

3. The method of claim 1, wherein the step of canceling the noise floor comprises forcing elements of the relative rms power array with values less that a predetermined value to zero.

\* \* \* \* \*